(12) United States Patent
Wang et al.

(10) Patent No.: US 9,343,421 B2
(45) Date of Patent: May 17, 2016

(54) SEMICONDUCTOR PACKAGE AND FABRICATION METHOD THEREOF

(71) Applicant: Siliconware Precision Industries Co., Ltd., Taichung (TW)

(72) Inventors: Lung-Yuan Wang, Taichung (TW); Cheng-Chia Chiang, Taichung (TW); Chu-Chi Hsu, Taichung (TW); Chia-Kai Shih, Taichung (TW); Shu-Huei Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/309,119

(22) Filed: Jun. 19, 2014

(65) Prior Publication Data

US 2015/0200169 A1    Jul. 16, 2015

(30) Foreign Application Priority Data

Jan. 16, 2014   (TW) .............................. 103101561 A

(51) Int. Cl.
*H01L 33/00*   (2010.01)
*H01L 23/00*   (2006.01)
(Continued)

(52) U.S. Cl.
CPC .............. *H01L 24/19* (2013.01); *H01L 21/568* (2013.01); *H01L 24/96* (2013.01); *H01L 25/105* (2013.01); *H01L 25/50* (2013.01); *H01L 23/3128* (2013.01); *H01L 23/49811* (2013.01); *H01L 23/5389* (2013.01); *H01L 2224/04105* (2013.01); *H01L 2224/12105* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/0651* (2013.01); *H01L 2225/06562* (2013.01); *H01L 2225/1023* (2013.01); *H01L 2225/1035* (2013.01); *H01L 2225/1041* (2013.01);

(Continued)

(58) Field of Classification Search
CPC ......... H01L 24/67; H01L 24/97; H01L 24/14; H01L 23/3107; H01L 23/535; H01L 24/19; H01L 21/486; H01L 2224/05572
USPC .................. 257/737, 777, 778, 686, E21.499, 257/E23.068; 438/107, 108, 109
See application file for complete search history.

(56) References Cited

U.S. PATENT DOCUMENTS 7,807,512 B2 * 10/2010 Lee ..................... H01L 21/6835
                                                            438/107
8,916,481 B2 * 12/2014 Gan et al. ..................... 438/760

(Continued)

*Primary Examiner* — Thinh T Nguyen
(74) *Attorney, Agent, or Firm* — Mintz Levin Cohn Ferris Glovsky and Popeo, P.C.; Peter F. Corless; Steven M. Jensen

(57) ABSTRACT

A method for fabricating a semiconductor package is provided, which includes the steps of: providing a first substrate having a plurality of first conductive posts on a surface thereof and providing a second substrate having a third surface having a chip disposed thereon and a fourth surface opposite to the third surface; disposing the first substrate on the third surface of the second substrate through the first conductive posts; forming an encapsulant between the first substrate and the second substrate, wherein the encapsulant has a first surface adjacent to the first substrate and a second surface opposite to the first surface; and removing the first substrate, thereby effectively preventing solder bridging from occurring.

2 Claims, 8 Drawing Sheets

(51) Int. Cl.
  *H01L 21/56* (2006.01)
  *H01L 25/10* (2006.01)
  *H01L 25/00* (2006.01)
  H01L 23/31 (2006.01)
  H01L 23/498 (2006.01)
  H01L 23/538 (2006.01)
(52) U.S. Cl.
  CPC .................. *H01L 2225/1058* (2013.01); *H01L 2924/00014* (2013.01); *H01L 2924/15311* (2013.01)

(56) References Cited

U.S. PATENT DOCUMENTS

| | | | |
|---|---|---|---|
| 2009/0239336 A1* | 9/2009 | Lee | H01L 21/6835 438/107 |
| 2010/0133704 A1* | 6/2010 | Marimuthu et al. | 257/778 |
| 2011/0014746 A1* | 1/2011 | Do | H01L 21/568 438/107 |
| 2013/0105991 A1* | 5/2013 | Gan et al. | 257/777 |

* cited by examiner

FIG.2C"

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 103101561, filed Jan. 16, 2014, the entire contents of which is incorporated herein by reference.

BACKGROUND OF THE INVENTION

1. Field of the Invention

The present invention relates to semiconductor packages and fabrication methods thereof, and more particularly, to a semiconductor package and a fabrication method thereof applicable to package on package (PoP) structures.

2. Description of Related Art

In recent years, to meet the miniaturization requirement of electronic products, PoP type packages have become an R&D focus since they facilitate to save planar area of substrates while maintaining good processing performances.

FIG. 1 is a schematic cross-sectional view of a conventional PoP type package. Referring to FIG. 1, a plurality of solder balls 11 are provided to serve as an interconnection structure for electrically connecting a lower packaging substrate 12 and an upper packaging substrate 13. However, as the I/O density of the package increases, if the size of the package does not change, the pitch between the solder balls 11 must be reduced. As such, solder bridging easily occurs between the solder balls 11.

Therefore, there is a need to provide a semiconductor package and a fabrication method thereof so as to overcome the above-described drawbacks.

SUMMARY OF THE INVENTION

In view of the above-described drawbacks, the present invention provides a method for fabricating a semiconductor package, which comprises the steps of: providing a first substrate having a plurality of first conductive posts on a surface thereof and a second substrate having a third surface having a chip disposed thereon and a fourth surface opposite to the third surface, and disposing the first substrate on the third surface of the second substrate through the first conductive posts; forming an encapsulant between the first substrate and the second substrate, wherein the encapsulant has a first surface adjacent to the first substrate and a second surface opposite to the first surface; and removing the first substrate.

In the above-described method, the third surface of the second substrate can further have a plurality of conductive pads that are correspondingly electrically connected to the first conductive posts so as to dispose the first substrate on the second substrate. The first substrate can have a dielectric layer, a first metal layer and a second metal layer sequentially stacked, and the first conductive posts are formed on the second metal layer.

In the above-described method, removing the first substrate can comprise removing the dielectric layer and the first metal layer first and then removing the second metal layer. A plurality of conductive elements can further be formed on top ends of the first conductive posts. A plurality of second conductive posts can further be formed on the conductive pads and correspondingly electrically connected to the first conductive posts. A plurality of conductive elements can further be formed on top ends of the second conductive posts.

After removing the first substrate, the method can further comprise forming an OSP (Organic Solderability Preservative) layer on the first conductive posts. After removing the first substrate, the method can further comprise forming a plurality of conductive elements on the fourth surface of the second substrate.

In the above-described method, the second substrate can have a first carrier and an adhesive layer sequentially stacked such that the first substrate is disposed on the second substrate with the first conductive posts attached to the adhesive layer, and after removing the first substrate, the method further comprises removing the second substrate so as to form a second redistribution layer on the second surface of the encapsulant. After removing the first substrate, the method can further comprise forming a first redistribution layer on the first surface of the encapsulant.

After forming the first redistribution layer, the method can further comprise: disposing a second carrier on the first redistribution layer and removing the second substrate so as to form a second redistribution layer on the second surface of the encapsulant; and removing the second carrier. After forming the second redistribution layer, the method can further comprise forming a plurality of conductive elements on the second redistribution layer.

The present invention further provides a semiconductor package, which comprises: an encapsulant having a first surface and a second surface opposite to the first surface; a chip embedded in the encapsulant and exposed from the second surface of the encapsulant; a plurality of conductive posts formed in the encapsulant and penetrating the first and second surfaces; a first redistribution layer formed on the first surface of the encapsulant and electrically connected to the conductive posts; and a second redistribution layer formed on the second surface of the encapsulant and electrically connected to the chip and the conductive posts.

The above-described semiconductor package can further comprise a plurality of conductive elements formed on the second redistribution layer.

Therefore, the prevent invention uses conductive posts to electrically connect upper and lower substrates. Since less space is consumed by the conductive posts compared with the conventional solder balls, the present invention meets the fine pitch requirement and prevents solder bridging from occurring.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second" etc. are merely for illustrative purposes and should not be construed to limit the scope of the present invention.

First Embodiment

FIGS. 2A to 2I are schematic cross-sectional views showing a method for fabricating a semiconductor package according to a first embodiment of the present invention and an application example of the semiconductor package.

Figure 1:
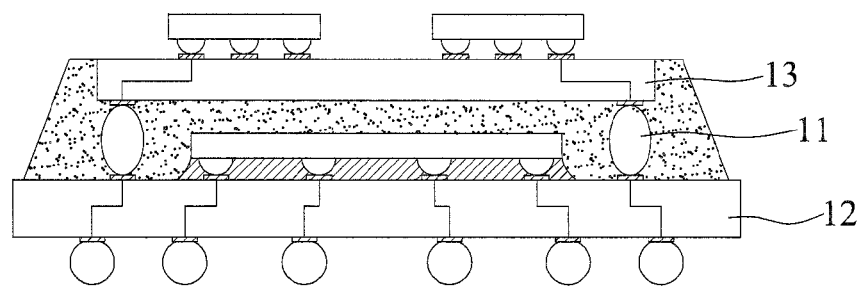
FIG. 1 is a schematic cross-sectional view of a conventional PoP type package.
Figure 2A:
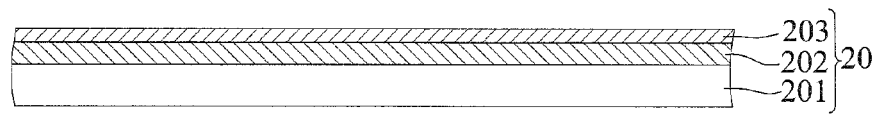
FIGS. 2A to 2I are schematic cross-sectional views showing a method for fabricating a semiconductor package according to a first embodiment of the present invention and an application example of the semiconductor package, wherein FIG. 2B' shows another embodiment of FIG. 2B, FIGS. 2C' and 2C" show other embodiments of FIG. 2C and FIG. 2D' shows another embodiment of FIG. 2D.

Referring to FIG. 2A, a first substrate 20 is provided, which has a dielectric layer 201, a first metal layer 202 and a second metal layer 203 sequentially stacked. The dielectric layer 201 can be made of FR4, the first metal layer 202 can be a copper layer and the second metal layer 203 can be a copper foil.

Figure 2B:
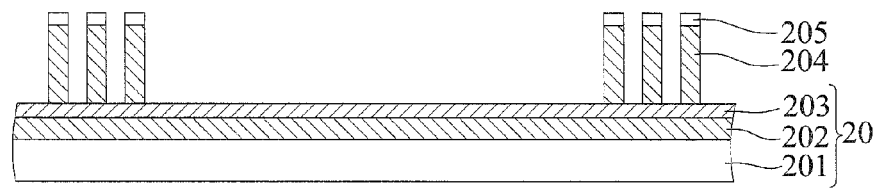
Figure 2B:
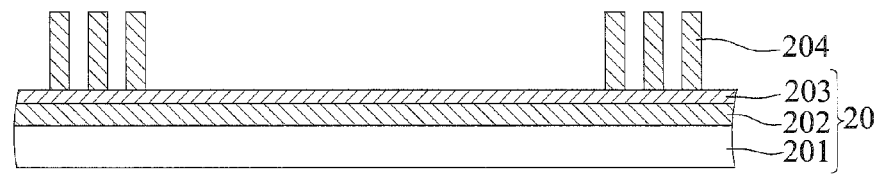

Referring to FIG. 2B, a plurality of first conductive posts 204 are formed on the second metal layer 203 of the first substrate 20. The first conductive posts 204 can be made of copper. In the present embodiment, a plurality of conductive elements 205 made of such as a solder material are further formed on top ends of the first conductive posts 204. In another embodiment, referring to FIG. 2B', the conductive elements 205 can be omitted.

Figure 2C:
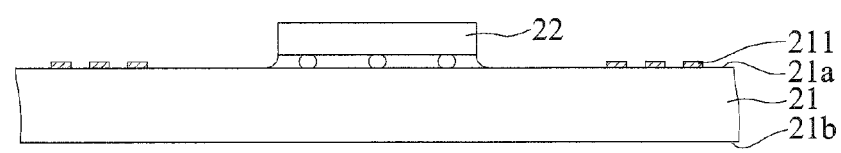
Figure 2C:
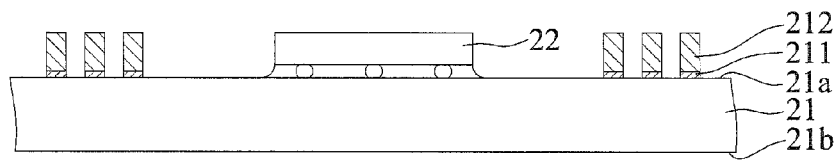

Referring to FIG. 2C, a second substrate 21 is provided. The second substrate 21 can be, for example, a BT substrate, an FR-4 substrate or a ceramic substrate. The second substrate 21 has a third surface 21a and a fourth surface 21b opposite to the third surface 21a. A chip 22 is disposed on the third surface 21a. Further, the third surface 21a has a plurality of conductive pads 211. Further, referring to FIG. 2C', a plurality of second conductive posts 212 can be formed on the conductive pads 211. Furthermore, referring to FIG. 2C'', a plurality of conductive elements 213 made of such as a solder material can be formed on the second conductive posts 212.

Figure 2D:
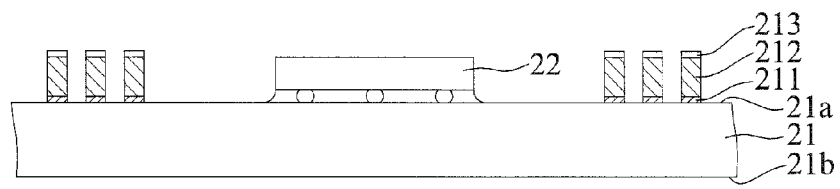
Figure 2D:
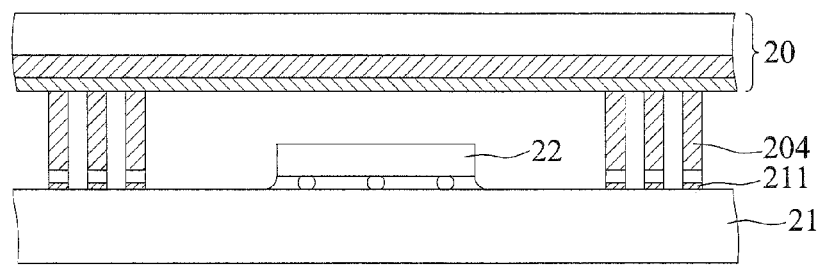
Figure 2D:
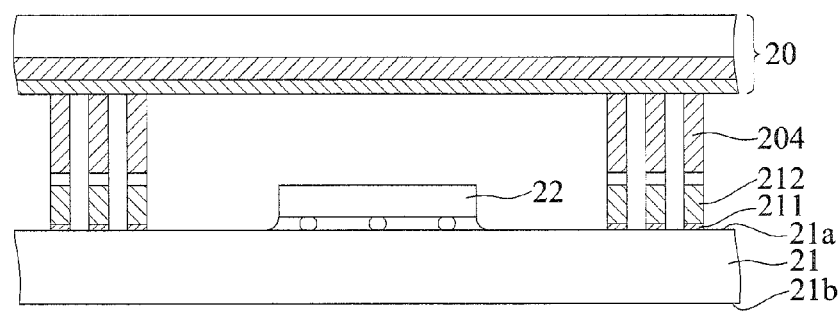

Referring to FIG. 2D, the first substrate 20 is disposed on the second substrate 21 by correspondingly electrically connecting the first conductive posts 204 to the conductive pads 211. In another embodiment, referring to FIG. 2D', the first conductive posts 204 are correspondingly electrically connected to the second conductive posts 212.

Figure 2E:
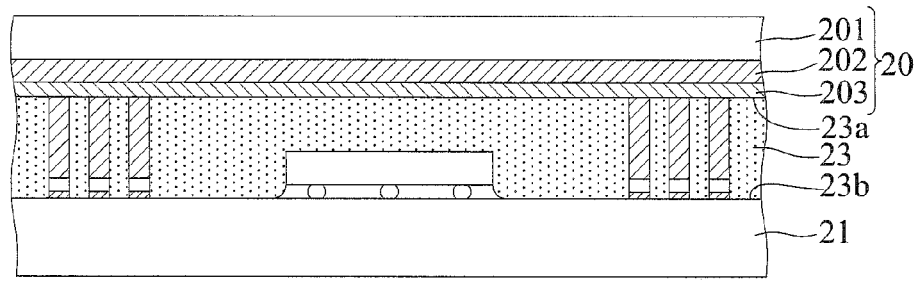

Referring to FIG. 2E, continued from FIG. 2D, an encapsulant 23 is formed between the first substrate 20 and the second substrate 21. The encapsulant 23 has a first surface 23a adjacent to the first substrate 20 and a second surface 23b opposite to the first surface 23a.

Figure 2F:
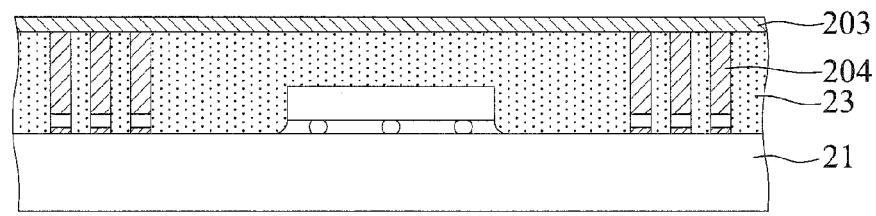

Referring to FIG. 2F, the dielectric layer 201 and the first metal layer 202 are removed by such as peeling.

Figure 2G:
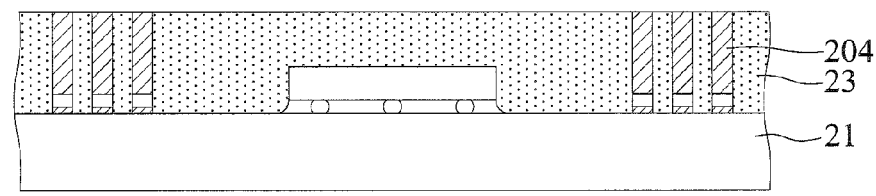

Referring to FIG. 2G, the second metal layer 203 is removed by such as etching to expose the first conductive posts 204. If needed, an OSP (Organic Solderability Preservative) layer (not shown) can be formed on the first conductive posts 204.

Figure 2H:
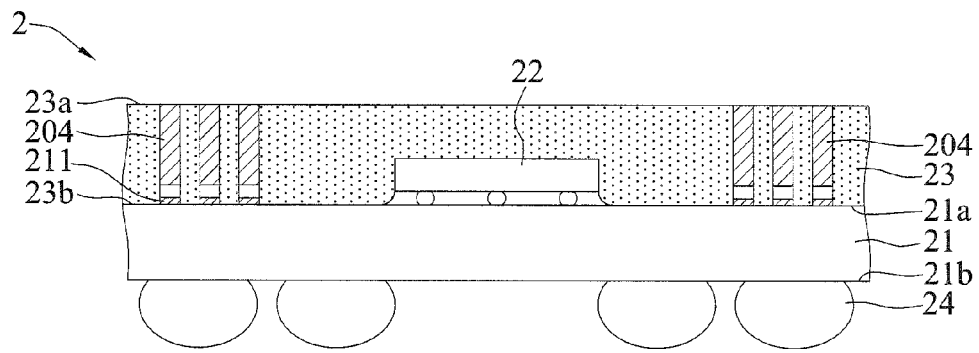

Referring to FIG. 2H, a plurality of conductive elements 24 are formed on the fourth surface 21b of the second substrate 21, thereby forming a semiconductor package 2.

Figure 2I:
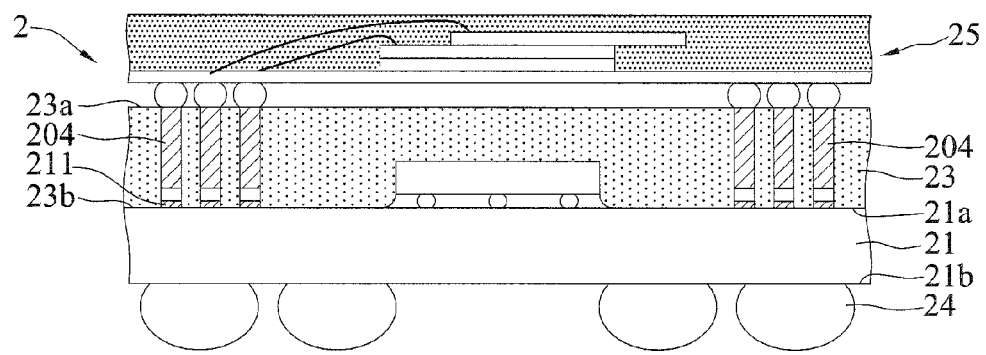

Referring to FIG. 2I, an electronic element 25, such as another semiconductor package or a semiconductor chip, is disposed on the semiconductor package 2 and electrically connected to the first conductive posts 204.

Second Embodiment

FIGS. 3A to 3K are schematic cross-sectional views showing a method for fabricating a semiconductor package according to a second embodiment of the present invention and an application example of the semiconductor package.

Figure 3A:
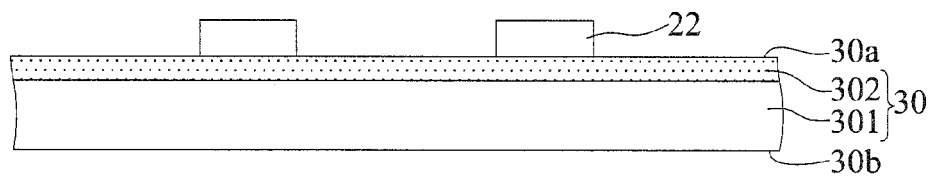
FIGS. 3A to 3K are schematic cross-sectional views showing a method for fabricating a semiconductor package according to a second embodiment of the present invention and an application example of the semiconductor package.

Referring to FIG. 3A, a second substrate 30 is provided, which has a first carrier 301 and an adhesive layer 302 sequentially stacked. The second substrate 30 has a third surface 30a having at least a chip 22 disposed thereon and a fourth surface 30b opposite to the third surface 30a. The first carrier 301 can be made of glass or silicon and in a wafer or panel form.

Figure 3B:
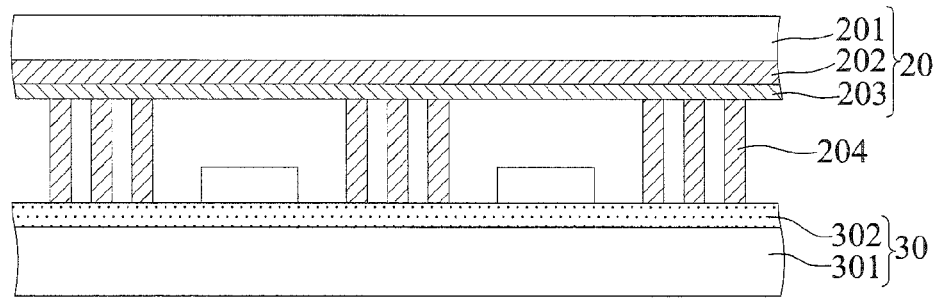

Referring to FIG. 3B, a first substrate 20 is provided, which has a dielectric layer 201, a first metal layer 202 and a second metal layer 203 sequentially stacked. The dielectric layer 201 can be made of FR4, the first metal layer 202 can be a copper layer and the second metal layer 203 can be a copper foil. A plurality of first conductive posts 204 are formed on the second metal layer 203 of the first substrate 20. The first substrate 20 is disposed on the second substrate 20 with the first conductive posts 204 attached to the adhesive layer 302.

Figure 3C:
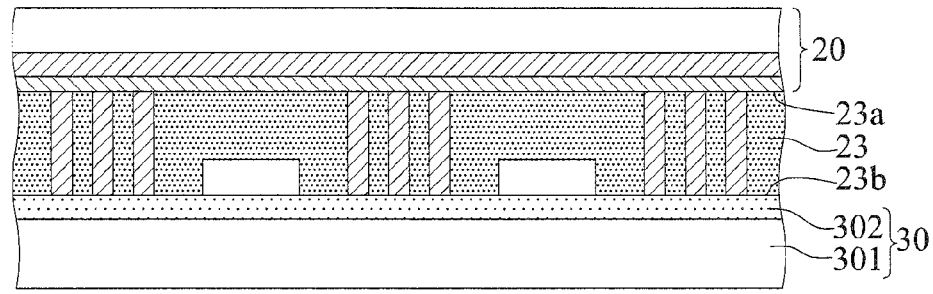

Referring to FIG. 3C, an encapsulant 23 is formed between the first substrate 20 and the second substrate 30. The encapsulant 23 has a first surface 23a adjacent to the first substrate 20 and a second surface 23b opposite to the first surface 23a.

Figure 3D:
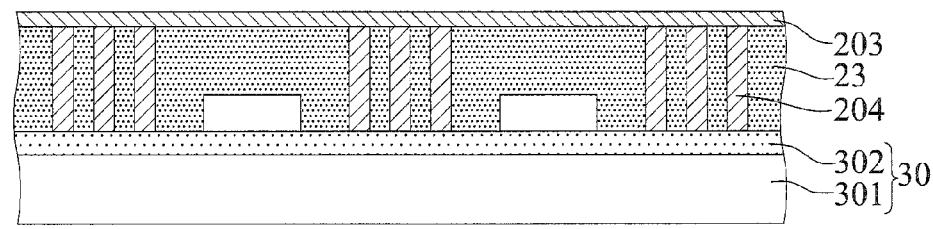

Referring to FIG. 3D, the dielectric layer 201 and the first metal layer 202 are removed by such as peeling.

Figure 3E:
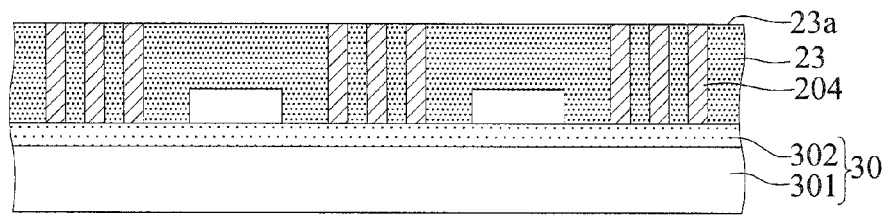

Referring to FIG. 3E, the second metal layer 203 is removed by such as etching to expose the first conductive posts 204. If needed, an OSP layer (not shown) can be formed on the first conductive posts 204.

Figure 3F:
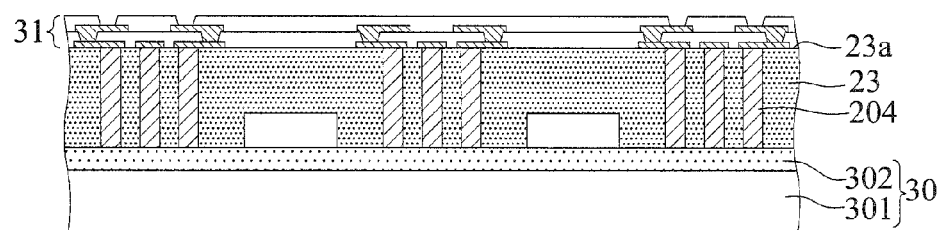
Figure 3G:
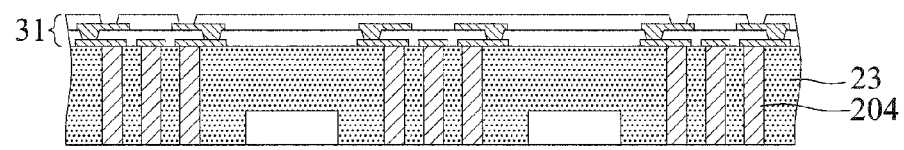

Referring to FIG. 3F, a first redistribution layer 31 is formed on the first surface 23a of the encapsulant 23.

Referring to FIG. 3O, the second substrate 30 is removed.

Figure 3H:
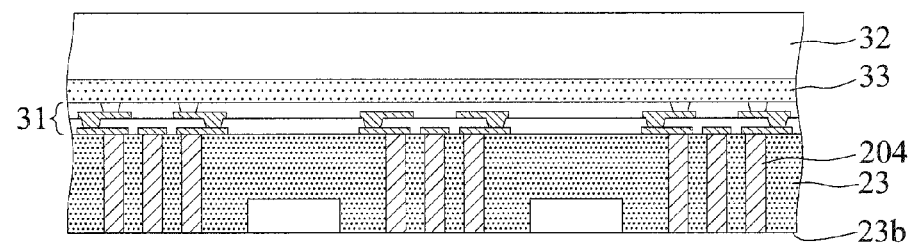

Referring to FIG. 3H, if needed, a second carrier 32 is disposed on the first redistribution layer 31 through an adhesive layer 33.

Figure 3I:
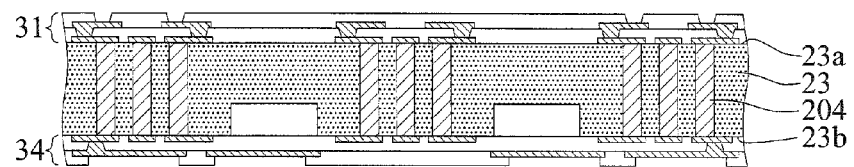

Referring to FIG. 3I, a second redistribution layer 34 is formed on the second surface 23b.

Figure 3J:
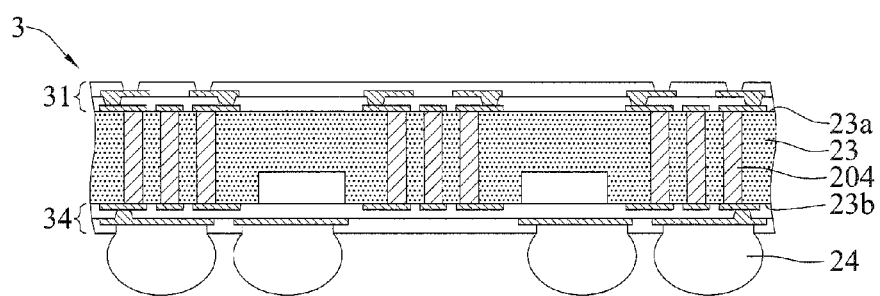

Referring to FIG. 3J, a plurality of conductive elements 24 are formed on the second redistribution layer 34, thereby forming a semiconductor package 3.

Figure 3K:
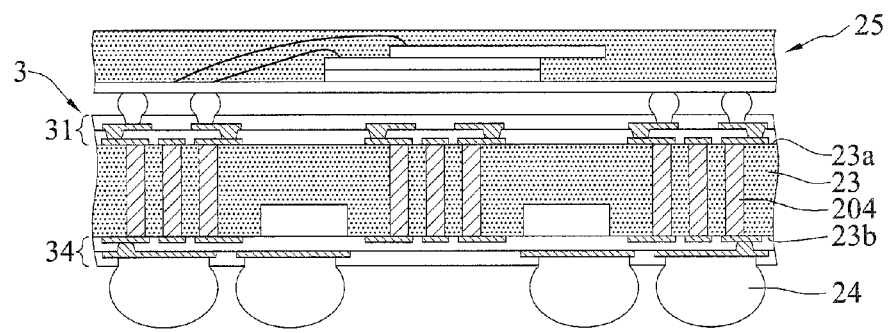

Referring to FIG. 3K, an electronic element 25, such as another semiconductor package or a semiconductor chip, is disposed on the semiconductor package 3 and electrically connected to the first conductive posts 204.

Referring to FIG. 3J, the present invention further provides a semiconductor package, which has: an encapsulant 23 having a first surface 23a and a second surface 23b opposite to the first surface 23a; a chip 22 embedded in the encapsulant 23 and exposed from the second surface 23b of the encapsulant 23; a plurality of first conductive posts 204 formed in the encapsulant 23 and penetrating the first and second surfaces 23a, 23b; a first redistribution layer 31 formed on the first surface 23a of the encapsulant 23 and electrically connected to the first conductive posts 204; and a second redistribution layer 34 formed on the second surface 23b of the encapsulant 23 and electrically connected to the chip 22 and the first conductive posts 204.

The above-described semiconductor package can further have a plurality of conductive elements 24 formed on the second redistribution layer 34.

According to the present invention, a plurality of conductive posts are formed to electrically connect upper and lower substrates and after an encapsulant is formed between the upper and lower substrates, the upper substrate is removed. Since less space is consumed by the conductive posts compared with the conventional solder balls, the present invention meets the fine pitch requirement and prevents solder bridging from occurring, thereby improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   an encapsulant having a first surface and a second surface opposite to the first surface;
   a chip embedded in the encapsulant, wherein the chip is exposed from the second surface of the encapsulant and free from being exposed from the first surface of the encapsulant;
   a plurality of conductive posts formed in the encapsulant and penetrating the first and second surfaces, wherein an upper surface and a lower surface of each of the conductive posts are flush with the first surface and the second surface of the encapsulant, respectively;
   a first redistribution layer formed on the first surface of the encapsulant and electrically connected to the conductive posts; and
   a second redistribution layer formed on the second surface of the encapsulant and electrically connected to the chip and the conductive posts.

2. The package of claim 1, further comprising a plurality of conductive elements formed on the second redistribution layer.

* * * * *